(12) United States Patent
Jang et al.

(10) Patent No.: US 6,985,401 B2
(45) Date of Patent: Jan. 10, 2006

(54) MEMORY DEVICE HAVING DELAY LOCKED LOOP

(75) Inventors: Eun Jung Jang, Songpa-gu (KR); Hyung Dong Lee, Seocho-gu (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 11 days.

(21) Appl. No.: 10/857,618

(22) Filed: Jun. 1, 2004

(65) Prior Publication Data

US 2005/0254318 A1 Nov. 17, 2005

(30) Foreign Application Priority Data

May 17, 2004 (KR) ...................... 10-2004-0034831

(51) Int. Cl.
*G11C 8/00* (2006.01)
(52) U.S. Cl. .................. 365/233; 365/194; 365/230.06
(58) Field of Classification Search ................ 365/233, 365/194, 236, 201, 189.01, 189.05
See application file for complete search history.

(56) References Cited

U.S. PATENT DOCUMENTS

| | | | |
|---|---|---|---|
| 6,166,990 A * | 12/2000 | Ooishi et al. ................ | 365/233 |
| 6,556,489 B2 * | 4/2003 | Gomm et al. ................ | 365/194 |
| 6,570,815 B2 | 5/2003 | Kashiwazaki | |
| 6,593,786 B2 | 7/2003 | Jung | |
| 6,693,474 B2 | 2/2004 | Kim | |
| 6,704,881 B1 | 3/2004 | Li et al. | |
| 6,724,686 B2 * | 4/2004 | Ooishi et al. ................ | 365/233 |
| 6,803,826 B2 | 10/2004 | Gomm et al. | |
| 2004/0012427 A1 | 1/2004 | Kim | |
| 2004/0124896 A1 | 7/2004 | Byun et al. | |

FOREIGN PATENT DOCUMENTS

| | | |
|---|---|---|
| JP | 2000-031954 | 1/2000 |
| JP | 2003-045183 | 2/2003 |
| JP | 2003-297083 | 10/2003 |
| JP | 2004-103061 | 4/2004 |

* cited by examiner

Primary Examiner—Gene N. Auduong
(74) Attorney, Agent, or Firm—Heller Ehrman LLP

(57) ABSTRACT

A memory device minimizes the skew between an external clock and a DQS (or DQ) after the locking state by regulating a delay ratio of a replica delay model to compensate errors of process, temperature or voltage change. The memory device comprises: an input clock buffer for buffering an externally inputted external clock to generate an internal clock; a DLL for delaying the internal clock to synchronize a phase of the external clock with that of a DQS; an output clock buffer for buffering an output clock outputted from the DLL; and an output control unit for generating the DQS using a clock outputted from the output clock buffer. Here, the DLL comprises a replica delay model for modeling delay factors of the input clock buffer and other delay factors until the output clock outputted from the delay line is outputted to the outside of a chip, and for regulating a delay ratio in response to a plurality of control signals inputted externally in a test mode.

20 Claims, 20 Drawing Sheets

MEMORY DEVICE HAVING DELAY LOCKED LOOP

BACKGROUND OF THE INVENTION

1. Field of the Invention

The present invention generally relates to a memory device including a delay locked loop (hereinafter, referred to as "DLL"), and more specifically, to a memory device including a DLL which is configured to minimize the skew an external clock and a DQS (or a DQ) after locking by compensating errors generated from process errors by a delay ratio of a replica delay model and from temperature or voltage change.

2. Description of the Prior Art

In general, a DLL is a circuit for controlling timing of data outputted externally from a DRAM by using an externally inputted external clock of the DRAM. In order to transmit data to a chipset without errors, the DRAM is required to be synchronized with the chipset at the same clock.

That is, when an externally inputted clock is inputted into the inside of the DRAM, a phase is delayed by logic circuits such as an clock input buffer, line loading and a data output buffer, and a phase of an external clock becomes different from that of an internal clock. As a result, the DLL is used to compensate the difference.

In this way, the DLL compensates a phase (clock skew) delayed by an internal circuit of the DRAM, and sets the timing of an externally inputted clock to be the same as when data sensed at the core of the DRAM are outputted from a data output buffer on a basis of an external clock so that the phase of data from the inside to the outside may not become different from that of the clock.

FIG. 1 is a block diagram illustrating a general memory device including a DLL.

The memory device includes an input clock buffer 2, a DLL 4, an output clock buffer 6 and an output control unit 8.

The input clock buffer 2 buffers an externally inputted external clock CLKEXT, and outputs an internal clock CLKIN.

The DLL 4 includes a phase detector 10, a delay line 11, a delay line controller 12 and a replica delay model 13. The phase detector 10 compares a phase of an internal clock CLKIN outputted from the input clock buffer 2 with that of a feedback clock FBCLK fed back through an internal circuit. The delay line 11 delays a phase of the internal clock CLKIN. The delay line controller 12 controls a delay ratio of the delay line 11 in response to a phase detecting signal outputted from the phase detector 10. The replica delay model 13 models delay factors of the input clock buffer 2 and other delay factors until an output clock CLKOUT outputted from the delay line 11 are outputted to the outside of the chip.

The phase detector 10 compares the internal clock CLKIN with the phase of the feedback clock FBCLK. That is, two clocks are compared on real time in order to synchronize a phase of the external clock CLKEXT and that a DQS.

The phase detector 10 provides comparison information to the delay line controller 12 (for example, a shift register array), and regulates a delay ratio of the delay line 11, thereby decreasing a phase difference of the two clocks.

The delay line 11 is controlled by the phase detector 10, and forms a delay path for determining a phase delay ratio. The delay line 11 includes a plurality of unit delay cells which are connected in series. A signal for controlling each unit delay signal corresponds one by one to a signal outputted from the delay line controller 12.

The delay line controller 12 includes a bidirectional shift register for setting a logic circuit for setting an input path of the delay line 11 and locations of paths. Here, the shift register is configured to set the initial maximum/minimum delay time.

The delay line controller 12 outputs a signal for controlling the delay line 11 in response to a state detected by the phase detector 10. The delay line controller 12 generates a shift left signal DELUP to increase a delay ratio at the lead state, and a shift right signal DELDN at the lag state. At the lock state, the delay line controller 12 does not generate a shift signal but outputs a synchronization state signal LOCK.

The replica delay model 13 shrinks, simplifies or uses an internal circuit as it is except the DLL from input to output of the external clock CLKEXT. The exact delay factors determine a skew value of performances of the DLL.

The output clock buffer 6 buffers the output clock CLKOUT outputted from the delay line 11.

The output control unit 8 generates a DQS by using a clock CLKINTP outputted from the output clock buffer 6.

FIG. 2 is a detailed block diagram illustrating the phase detector 10 of FIG. 1.

The phase detector 10 includes phase detecting units 16 and 18, and a delay unit 20. Here, the delay unit 20 includes a unit delay cell.

The first phase detecting unit 16 compares a phase of the internal clock CLKIN with that of the feedback clock FBCLK. When a rising edge of the feedback clock FBCLK is in a low pulse of the internal clock CLKIN, that is, the rising edge of the feedback clock FBCLK leads that of the internal clock CLKIN, an output signal DET1 of the first phase detecting unit 16 becomes at a low level. However, when the rising edge of the feedback clock FBCLK lags that of the internal clock CLKIN, the output signal DET1 of the first phase detecting unit 16 becomes at a high level.

The second phase detecting unit 18 compares a phase of the internal clock CLKIN with that of a delay feedback clock FBCLKD delayed by the delay unit 20. When a rising edge of the delay feedback clock FBCLKD is in a low pulse of the internal clock CLKIN, that is, the rising edge of the delay feedback clock FBCLKD leads that of the internal clock CLKIN, an output signal DET2 of the second phase detecting unit 18 becomes at a low level. However, when the rising edge of the delay feedback clock FBCLKD lags that of the internal clock CLKIN, the output signal DET2 of the second phase detecting unit 18 becomes at a high level.

FIGS. 3a to 3d are timing diagrams illustrating the operation of the phase detector 10 of FIG. 2.

FIG. 3 is a timing diagram when the rising edges of the feedback clock FBCLK and the delay feedback clock signal FBCLKD lag that of the internal clock CLKIN. As a result, the output signals DET1 and DET2 of the first phase detecting unit 16 and the second phase detecting unit 18 in the phase detector 10 of FIG. 2 become all at the high level, and the delay line controller 12 generates a delay up signal DELUP for increasing a delay ratio of the delay line 11.

As shown in FIG. 3b, the feedback clock FBCLK and the delay feedback clock FBCLKD are delayed, the rising edge of the feedback clock FBCLK lags that of the internal clock CLKIN, and the rising edge of the delay feedback clock FBCLKD leads that of the internal clock CLKIN. As a result, the output signal DET1 of the first phase detecting unit 16 becomes at the high level, and the output signal DET2 of the second phase detecting unit 18 transits from the high level to a low level. Then, the delay line controller 12 generates the delay up signal DELUP for increasing a delay ratio of the delay line 11.

As shown in FIG. 3c, the feedback clock FBCLK and the delay feedback clock FBCLKD are delayed, and the rising edges of the feedback clock FBCLK and the delay feedback clock signal FBCLKD lead that of the internal clock CLKIN. As a result, the output signals DET1 and DET2 of the first phase detecting unit 16 and the second phase detecting unit 18 become all at the low level. Then, the delay line controller 12 generates the delay up signal DELUP for increasing a delay ratio of the delay line 11.

As shown in FIG. 3d, the feedback clock FBCLK and the delay feedback clock FBCLKD are delayed, the rising edge of the feedback clock FBCLK leads that of the internal clock CLKIN, and the rising edge of the delay feedback clock FBCLKD lags that of the internal clock CLKIN. As a result, the output signal DET1 of the first phase detecting unit 16 becomes at the low level, and the output signal DET2 of the second phase detecting unit 18 transits from the low level to the high level. Then, the rising edge of the internal clock CLKIN becomes closer to that of the feedback clock FBCLK at a less than predetermined interval, which results in a lock state. Here, whether a delay up signal DELUP or a delay down signal DELDN outputted from the delay line controller 12 is generated only by the output signal DET1 from the first phase detecting unit 16 is determined. That is, the delay up signal DELUP is outputted when the output signal DET1 from the first phase detecting unit 16 is at the low level, and the delay down signal DELDN is outputted when the output signal DET1 is at the high level.

FIG. 4 is a detailed block diagram illustrating a delay line 11 of FIG. 1.

The delay line 11 includes a plurality of unit delay cells 22 which are connected in series and whose delay paths are set in response to the output signals DELUP and DELDN from the delay line controller 12.

If the delay up signal DELUP is outputted from the delay line controller 12, the delay path of the delay line 11 is set as shown in A of FIG. 4, and the delay ratio increases. If the delay down signal DELDN is outputted, the delay path of the delay line 11 is set as shown in B of FIG. 4, and the delay ratio decreases.

FIGS. 5a and 5b are timing diagrams illustrating the lock state of the memory device of FIG. 1.

FIG. 5a is a timing diagram illustrating the ideal case. The rising edge of the internal clock CLKIN becomes identical with that of the feedback clock FBCLK delayed by a delay time D1 of the replica delay model 13 at the lock state. Here, the rising edge of the external clock CLKEXT is identical with that of the DQS obtained by delaying the output clock CLKOUT of the DLL for a delay time D2 by the output clock buffer 6 and the output control unit 8.

FIG. 5b is a timing diagram when the rising edge of the DQS is not identical with that of the external clock signal CLKEXT.

Referring to FIG. 5b, the feedback clock FBCLK delayed by the delay time D1 of the replica delay model 13 is identical with the rising edge of the internal clock CLKIN at the lock state. When a delay time D3 of the output clock CLKOUT of the DLL 4 so that the rising edge of the DQS may be identical with that of the external clock signal CLKEXT is not identical with the delay time D2 of the output clock CLKOUT of the DLL 4 delayed by the output clock buffer 6 and the output control unit 8, the rising edge of the external clock signal CLKEXT is not identical with that of the DQS.

Accordingly, it is impossible to regulate the delay ratio of the replica delay model 13 in order to identify the actual delay time D2 with the ideal delay time D3 in the conventional memory device. As a result, the skew between the external clock CLKEXT and the DQS (or DQ) cannot be reduced.

SUMMARY OF THE INVENTION

It is an object of the present invention to minimize the skew between the external clock and the DQS or DQ after the locking state by regulating the delay ratio of the replica delay model.

In an embodiment, a memory device comprises: an input clock buffer for buffering an externally inputted external clock to generate an internal clock; a DLL for delaying the internal clock to synchronize a phase of the external clock with that of a DQS; an output clock buffer for buffering an output clock outputted from the DLL; and an output control unit for generating the DQS using a clock outputted from the output clock buffer. Here, the DLL comprises a delay line, a phase detector, a delay line controller and a replica delay model. The delay line delays a phase of the internal clock. The phase detector compares a phase of the internal clock with that of a feedback clock fed back through an internal circuit. The delay line controller regulates a delay ratio to delay the internal clock in response to a phase detecting signal outputted from the phase detector. The replica delay model models delay factors of the input clock buffer and other delay factors until the output clock outputted from the delay line is outputted to the outside of a chip, and regulates a delay ratio in response to a plurality of control signals inputted externally in a test mode.

In another embodiment, a memory device comprises: an input clock buffer for buffering an externally inputted external clock to generate an internal clock; a DLL for delaying the internal clock to synchronize a phase of the external clock with that of a DQS; an output clock buffer for buffering an output clock outputted from the DLL; and an output control unit for generating the DQS using a clock outputted from the output clock buffer. Here, the DLL comprises a delay line, a first phase detector, a delay line controller, a replica delay model controller and a replica delay model. The delay line delays a phase of the internal clock. The first phase detector compares a phase of the internal clock outputted from the input clock buffer with that of a feedback clock fed back through an internal circuit. The delay line controller regulates a delay ratio to delay the internal clock in response to a phase detecting signal outputted from the phase detector. The replica delay model controller compares a phase of the external clock with that of the DQS. The replica delay model models delay factors of the input clock buffer and other delay factors until the output clock outputted from the delay line is outputted to the outside of a chip, and regulates a delay ratio in response to an output signal outputted from the replica delay model controller in a test mode.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
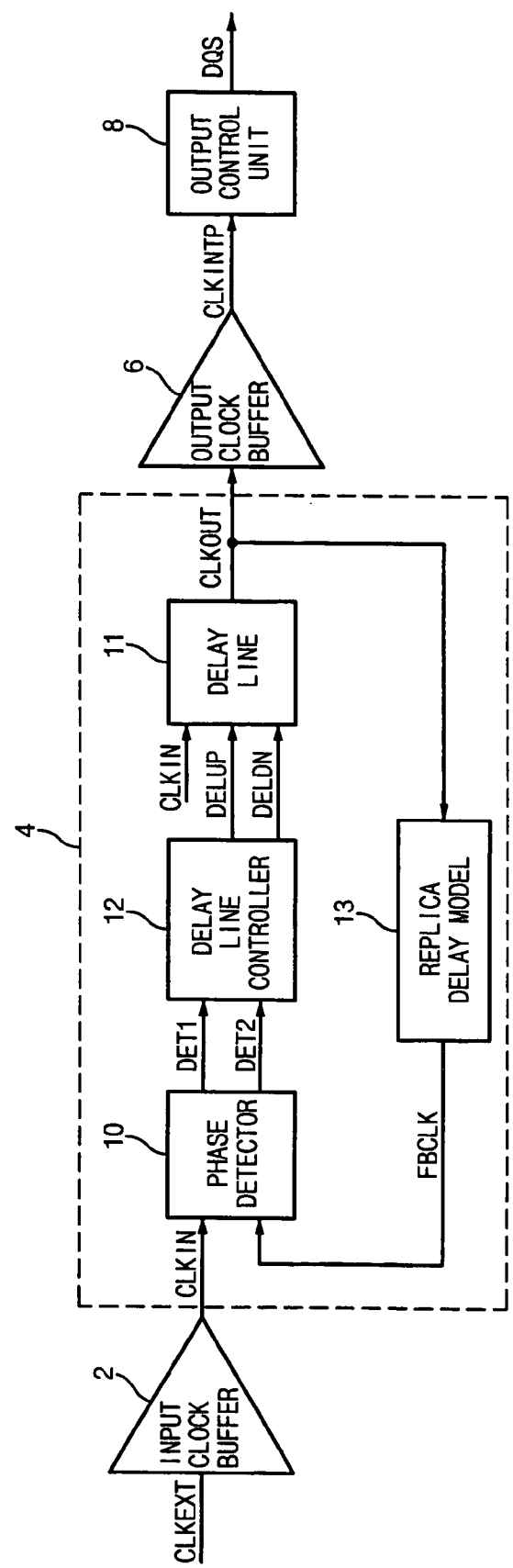
FIG. 1 is a block diagram illustrating a general memory device including a DLL.
Figure 2:
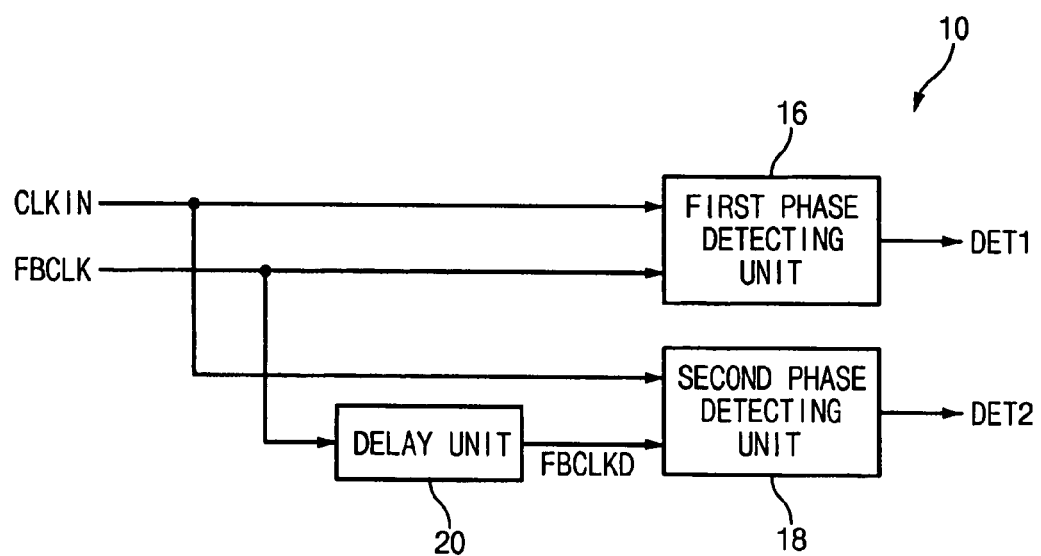
FIG. 2 is a detailed block diagram illustrating a phase detector 10 of FIG. 1.
Figure 3A:
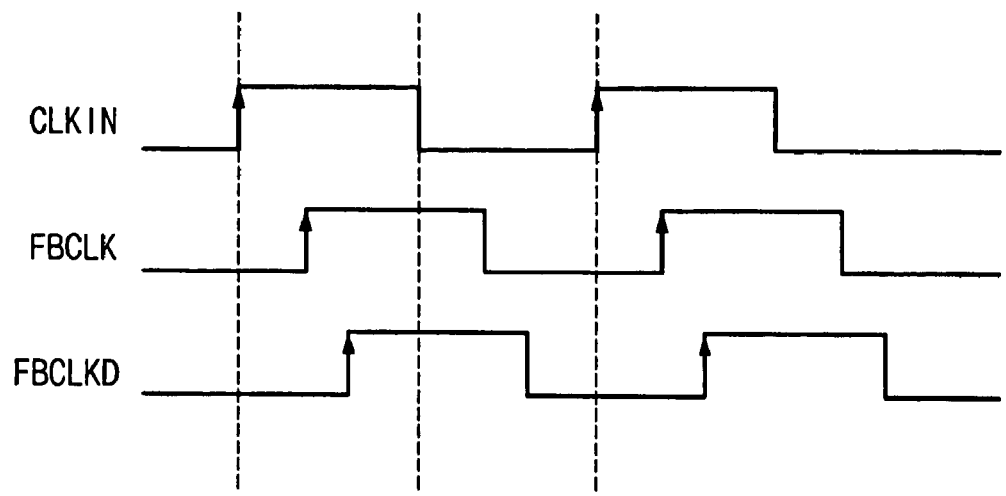
FIGS. 3a to 3d are timing diagrams illustrating the operation of the phase detector 10 of FIG. 2.
Figure 3B:
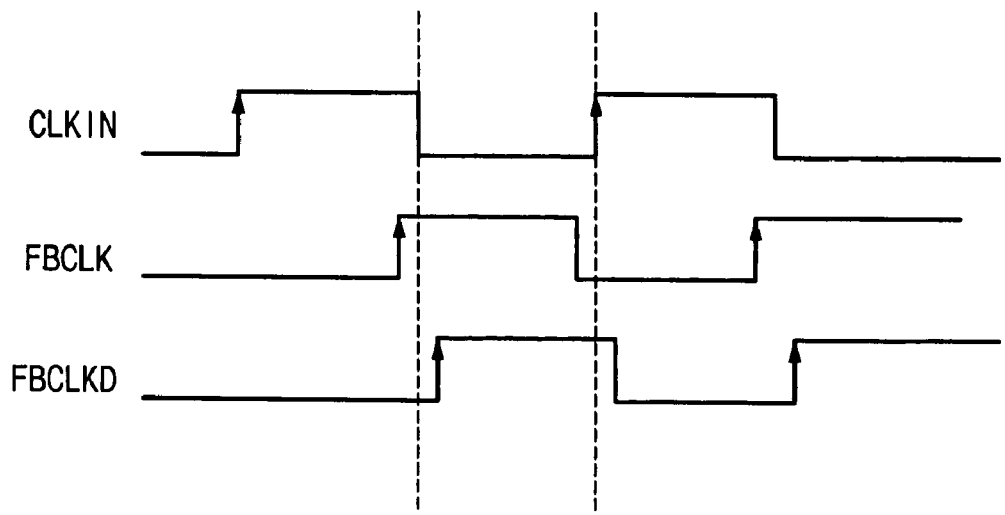
Figure 3C:
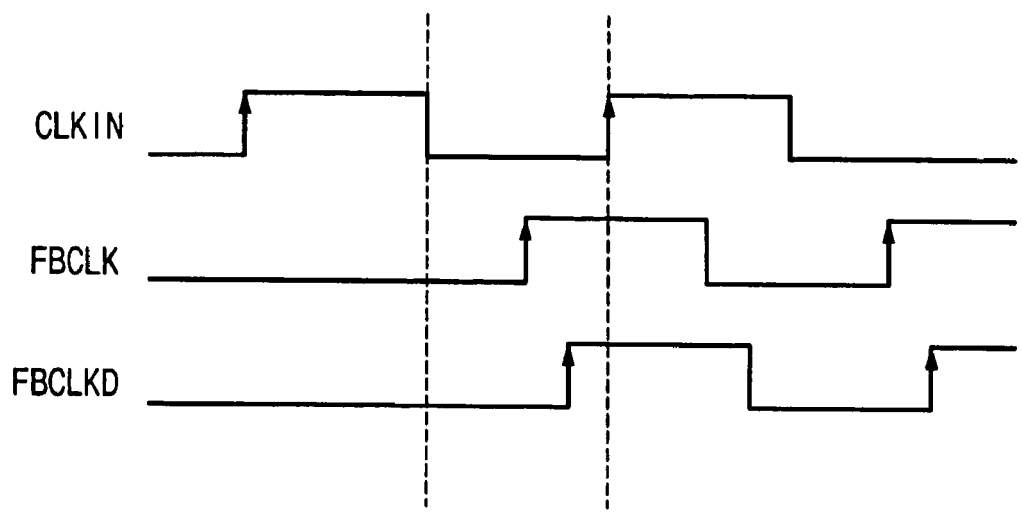
Figure 3D:
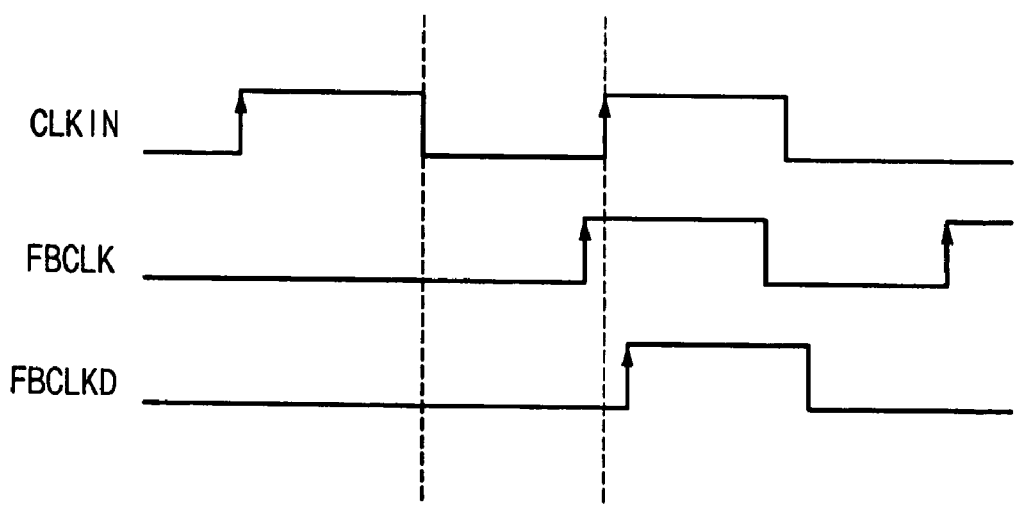
Figure 4:
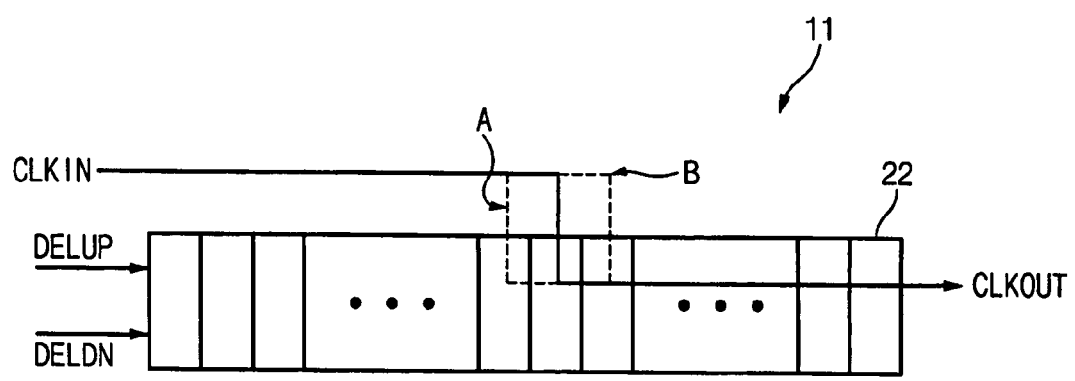
FIG. 4 is a detailed block diagram illustrating a delay line 11 of FIG. 1.
Figure 5A:
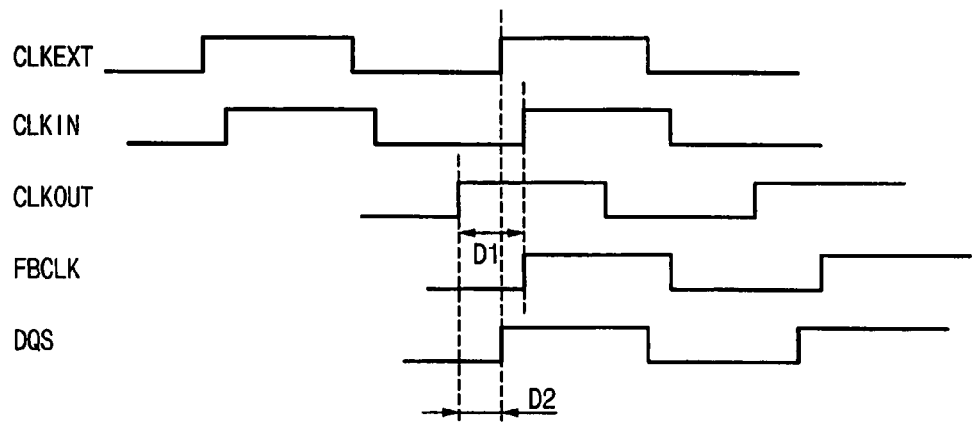
FIGS. 5a and 5b are timing diagrams illustrating the lock state of the memory device of FIG. 1.
Figure 5B:
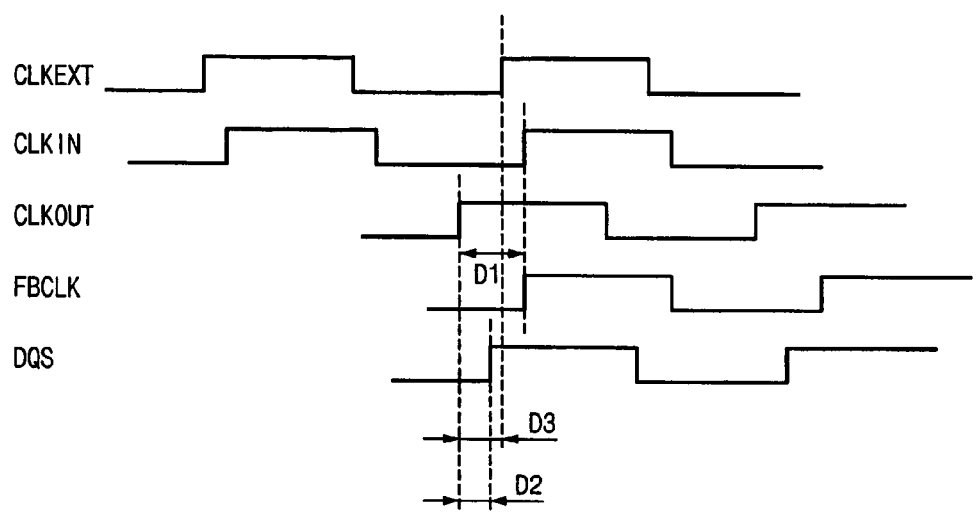
Figure 6:
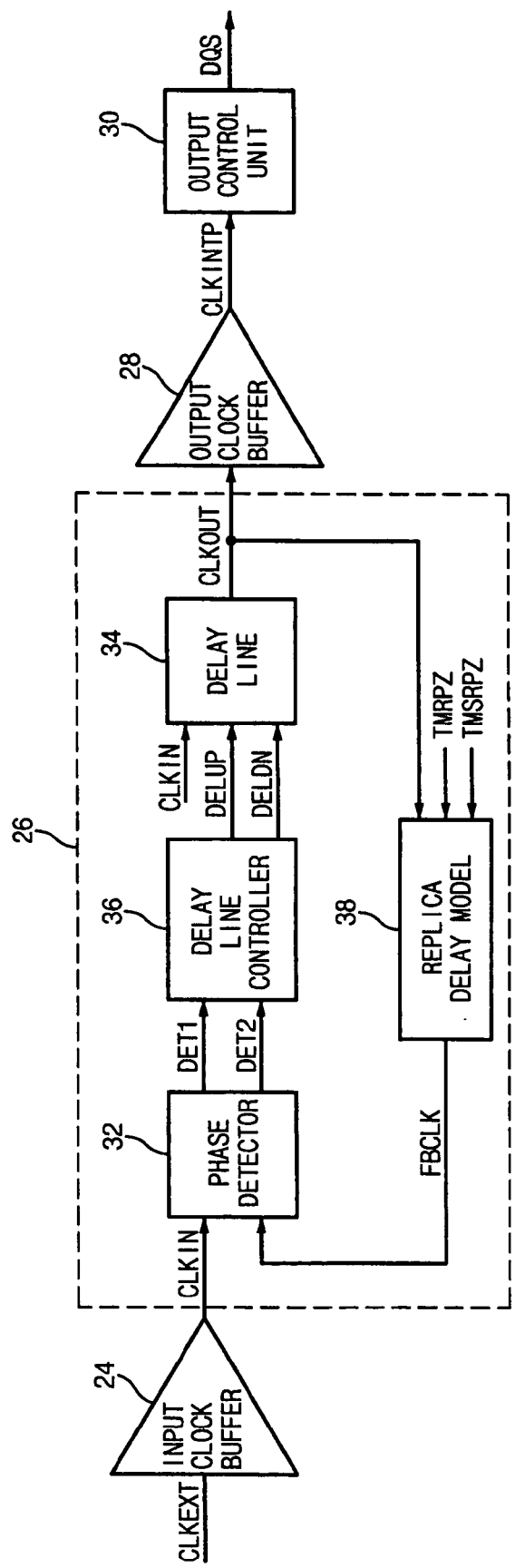
FIG. 6 is a block diagram illustrating a memory device including a DLL according to an embodiment of the present invention.

FIG. 6 is a block diagram illustrating a memory device including a DLL according to an embodiment of the present invention.

In an embodiment, the memory device includes an input clock buffer 24, a DLL 26, an output clock buffer 28 and an output control unit 30.

The input clock buffer 24 buffers an externally inputted external clock CLKEXT to an internal clock CLKIN.

The DLL 26 includes a phase detector 32, a delay line 34, a delay line controller 36 and a replica delay model 38. The phase detector 32 compares a phase of an internal clock CLKIN outputted from the input clock buffer 24 with that of a feedback clock FBCLK fed back through an internal clock. The delay line 34 delays a phase of the internal clock CLKIN. The delay line controller 36 regulates a delay ratio of the delay line 34 in response to a phase detecting signal outputted from the phase detector 32. The replica delay model 36 models delay factors of the input clock buffer 24 and other delay factors until the output clock CLKOUT outputted from the delay line 34 is outputted to the outside of a chip.

The delay line 34 is controlled by the phase detector 32 and forms a delay path for determining a phase delay ratio. Here, the delay line 34 includes a plurality of unit delay cells connected in series, and signals for controlling each unit delay cell correspond one by one to signals outputted from the delay line controller 36.

The delay line controller 36 includes a bidirectional shift register which sets a logic circuit for setting input paths of the delay line 34 and locations of paths. Here, the shift register is configured to set the initial maximum/minimum delay time.

The delay line controller 36 outputs a signal for controlling the delay line 34 in response to a state detected by the phase detector 32. The delay line controller 36 outputs a shift left signal DELUP to increase the delay ratio at the lead state, and a shift right signal DELDN to decrease the delay ratio at the lag state. However, the delay line controller 36 does not generate a shift signal but outputs a synchronization state signal LOCK at the lock state.

The replica delay model 38 shrinks, simplifies or uses an internal circuit as it is except the DLL from input to output of the external clock CLKEXT as a DQS. The replica delay model 38 regulates the delay ratio in response to control signals TMRPZ and TMSRPZ externally inputted in a test mode. Here, the control signals TMRPZ and TMSRPZ are generated from a receiver of the system.

The output clock buffer 28 buffers the output clock CLKOUT outputted from the delay line 34.

The output control unit 30 generates the DQS using a clock CLKINTP outputted from the output clock buffer 28.

Figure 7:
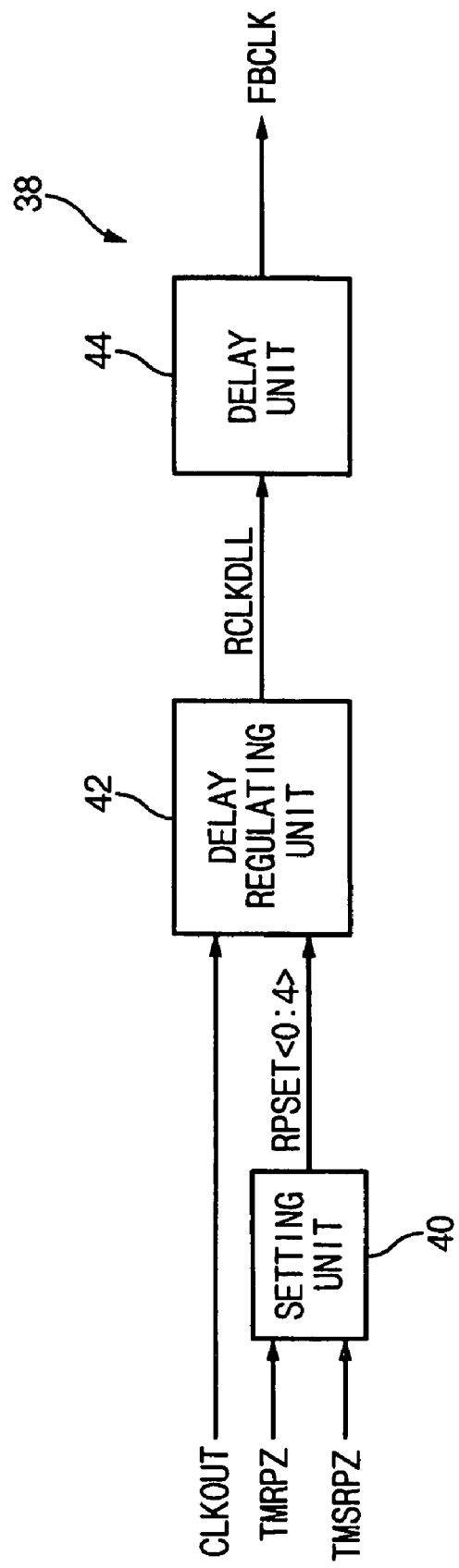
FIG. 7 is a detailed block diagram illustrating a replica delay model 38 of FIG. 6.

FIG. 7 is a detailed block diagram illustrating the replica delay model 38 of FIG. 6.

The replica delay model 38 includes a setting unit 40, a delay controller 42 and a delay unit 44.

The setting unit 40 generates delay setting data RPSET<0:4> in response to the control signals TMRPZ and TMSRPZ.

The delay ratio of the delay regulating unit 42 is regulated in response to the delay setting data RPSET<0:4> outputted from the setting unit 40. As a result, the delay regulating unit 42 outputs a clock RCLKDLL obtained by delaying the output clock CLKOUT depending on the set delay ratio.

The delay unit 44 outputs the feedback clock signal FBCLK by delaying the clock RCLKDLL outputted from the delay regulating unit 42 for a predetermined time.

Figure 8:
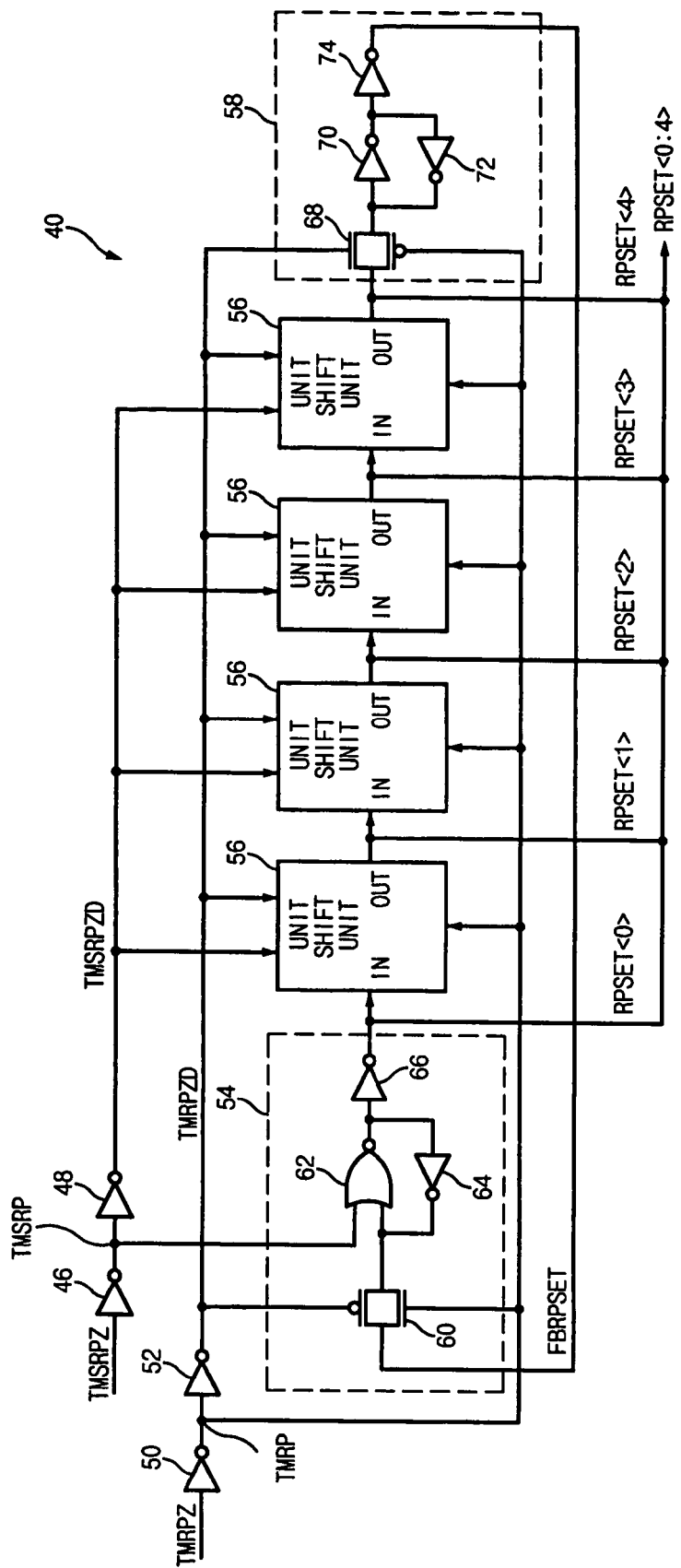
FIG. 8 is a detailed circuit diagram illustrating a setting unit 40 of FIG. 7.

FIG. 8 is a detailed circuit diagram illustrating the setting unit 40 of FIG. 7.

The setting unit 40 includes a plurality of inverters 46, 48, 50 and 52, a feedback input unit 54, a plurality of unit shift units 56 and a feedback output unit 58.

The inverters 46 and 48 sequentially invert the control signal TMSRPZ, and the inverters 50 and 52 sequentially invert the control signal TMRPZ.

The feedback input unit 54 includes a transmission gate 60, a NOR gate 62, and inverters 64 and 66. The transmission gate 60 is controlled by the control signals TMRP and TMRPZD outputted from the inverters 50 and 52, and selectively transmits a feedback signal RBRPSET outputted from the feedback output unit 58. The NOR gate 62 and the inverter 64 selectively latch a signal transmitted by the transmission gate 60 in response to the signal TMSRP outputted from the inverter 46. The inverter 66 inverts an output signal from the NOR gate 62. Here, when the output signal TMSRP from the inverter 46 is at a high level, first setting data RPSET<0> outputted from the feedback input unit 54 is initialized to a high level regardless of an output signal FBRPSET from the feedback output unit 58.

The plurality of unit shift units 56 are controlled by the output signal TMSRPZD from the inverter 48, and sequentially shift the output signal RPSET<0> from the feedback input unit 54 in every cycle of the output signals TMRP and TMRPZD from the inverters 50 and 52. Here, output signals RPSET<1:4> from each unit shift unit as well as the output signal RPSET<0> from the feedback input unit 54 become the delay setting data RPSET<0:4>.

The feedback output unit 58 includes a transmission gate 68, and inverters 70, 72 and 74. The transmission gate 68 is controlled by the output signals TMRP and TMRPZD from the inverters 50 and 52, and selectively transmits the setting data RPSET<4> from the final unit shift unit 56. The inverters 70 and 72 latch an output signal from the transmission gate 68. The inverter 74 inverts an output signal from the inverter 70.

Figure 9:
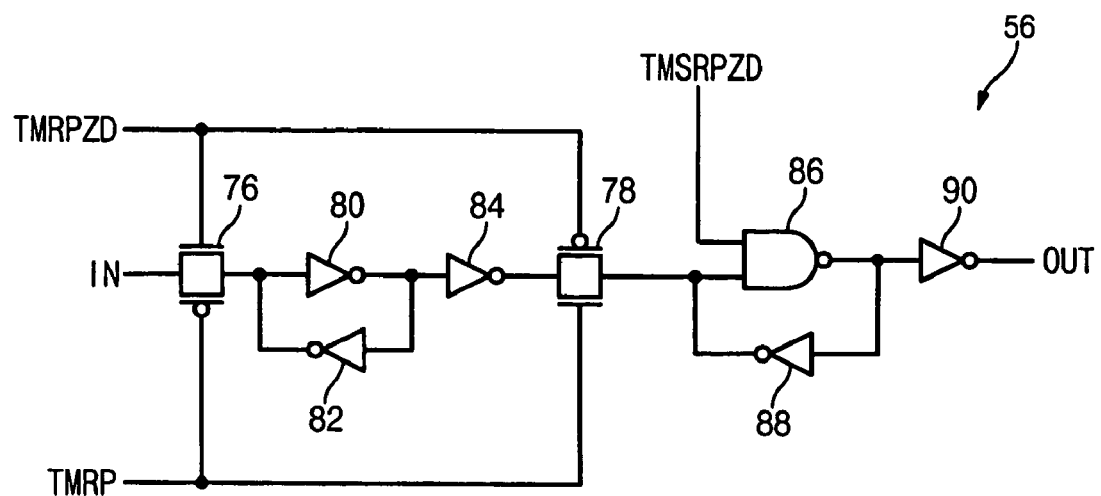
FIG. 9 is a detailed circuit diagram illustrating a unit shift unit 56 of FIG. 8.

FIG. 9 is a detailed circuit diagram illustrating the unit shift unit 56 of FIG. 8.

The unit shift unit 56 includes transmission gates 76 and 78, inverters 80, 82, 84, 88 and 90, and a NAND gate 86.

The transmission gate 76 is controlled by the output signals TMRP and TMRPZD from the inverters 50 and 52, and selectively transmits a signal IN inputted to the input terminal.

The inverters 80 and 82 latch a signal transmitted by the transmission gate 76, and the inverter 84 inverts an output signal from the inverter 80.

The transmission gate 78 is controlled by the output signals TMRP and TMRPZD from the inverters 50 and 52, and selectively transmits an output signal from the inverter 84.

The NAND gate 86 and the inverter 88 selectively latch a signal transmitted by the transmission gate 78 in response to the output signal TMSRPZD from the inverter 48. The inverter 90 inverts an output signal from the NAND gate 86. Here, when the output signal TMSRPZD from the inverter 48 is at a low level, an output signal OUT from the output terminal is initialized to a low level regardless of a signal applied to the input terminal.

Figure 10:
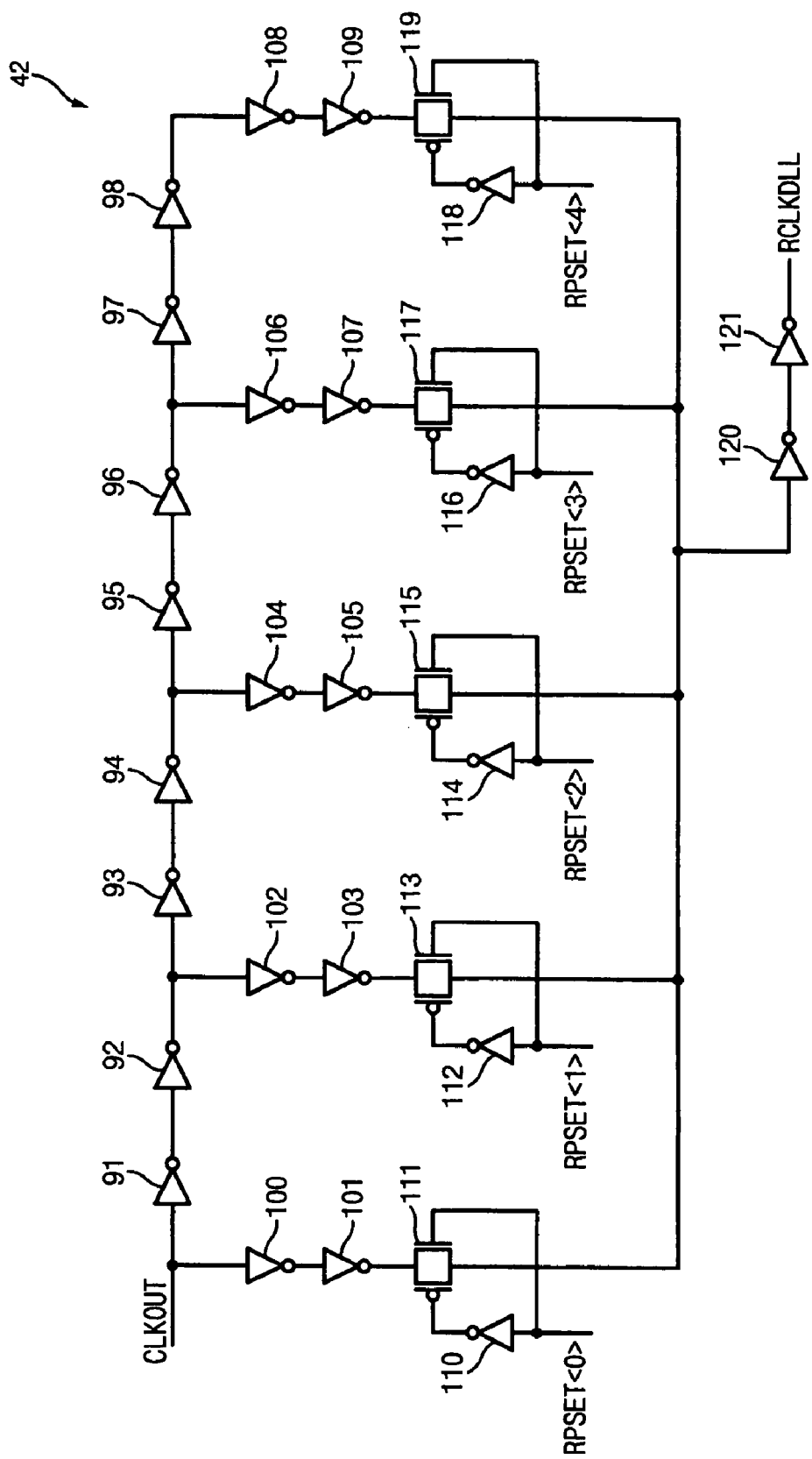
FIG. 10 is a detailed circuit diagram illustrating a delay regulating unit 42 of FIG. 7.

FIG. 10 is a detailed circuit diagram illustrating the delay regulating unit 42 of FIG. 7.

The delay regulating unit 42 includes a plurality of inverters 91~121, and a plurality of transmission gates 111, 113, 115, 117 and 119.

The transmission gate 111 selectively transmits a signal obtained by delaying the output clock CLKOUT through a delay path formed by the inverters 100 and 101 in response to the delay setting data RPSET<0> and a signal inverted by the inverter 110.

The transmission gate 113 selectively transmits a signal obtained by delaying the output clock CLKOUT through a delay path formed by the inverters 91, 92, 102 and 103 in response to the delay setting data RPSET<1> and a signal inverted by the inverter 112.

The transmission gate 115 selectively transmits a signal obtained by delaying the output clock CLKOUT through a delay path formed by the inverters 91, 92, 93, 94, 104 and 105 in response to the delay setting data RPSET<2> and a signal inverted by the inverter 114.

The transmission gate 117 selectively transmits a signal obtained by delaying the output clock CLKOUT through a delay path formed by the inverters 91, 92, 93, 94, 95, 96, 106 and 107 in response to the delay setting data RPSET<3> and a signal inverted by the inverter 116.

The transmission gate 119 selectively transmits a signal obtained by delaying the output clock CLKOUT through a delay path formed by the inverters 91, 92, 93, 94, 95, 96, 97, 98, 108 and 109 in response to the delay setting data RPSET<4> and a signal inverted by the inverter 118.

The inverters 120 and 121 sequentially invert a signal transmitted by the transmission gates 111, 113, 115, 117 and 119.

Figure 11:
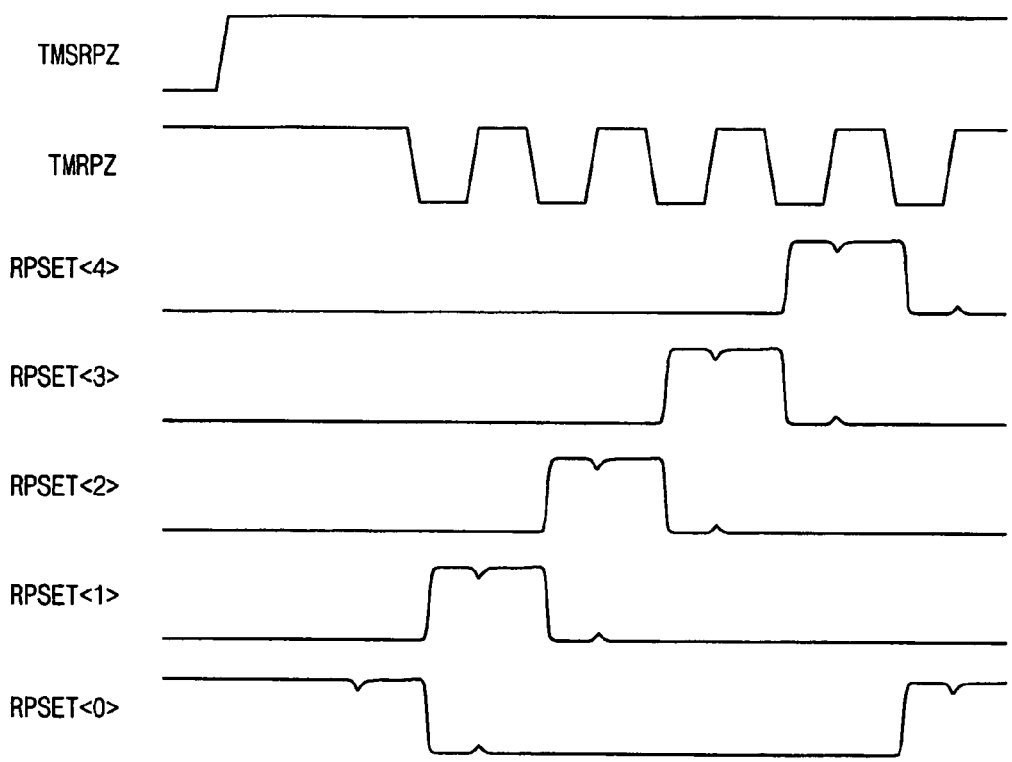
FIG. 11 is a timing diagram illustrating the operation of the setting unit 40 of FIG. 7.

FIG. 11 is a timing diagram illustrating the operation of the setting unit 40 of FIG. 7.

When the phase difference of DQS and the external clock CLKEXT is over a predetermined phase difference, the control signal TMSRPZ becomes enabled to a high level, and the control signal TMRPZ toggles periodically. As a result, the delay setting data RPSET<0> initialized to a high level in the first cycle of the control signal TMRPZ is shifted to the first unit shift 56. In the same way, the delay setting data RPSET<i> outputted from the previous unit shift unit 56 in every cycle of the control signal TMRPZ is shifted to the next unit shift unit 56. Also, the delay setting data RPSET<4> outputted from the final unit shift unit 56 is shifted again to the first unit shift unit 56 through the feedback output unit 58 and the feedback input unit 54 by toggle of the control signal TMRPZ.

Figure 12:
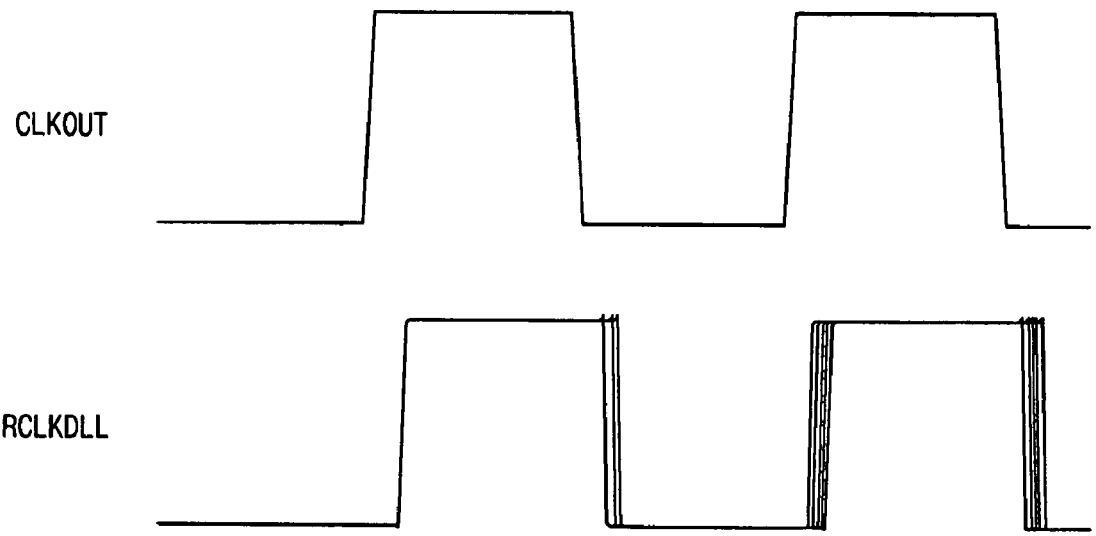
FIG. 12 is a timing diagram illustrating the operation of the delay regulating unit 42 of FIG. 7.

FIG. 12 is a timing diagram illustrating the operation of the delay regulating unit 42 of FIG. 7. The delay ratio of output clock CLKOUT is regulated in response to the delay setting data RPSET<0:4>, and the timing of the output clock RCLKDLL from the delay regulating unit 42 is changed.

Figure 13:
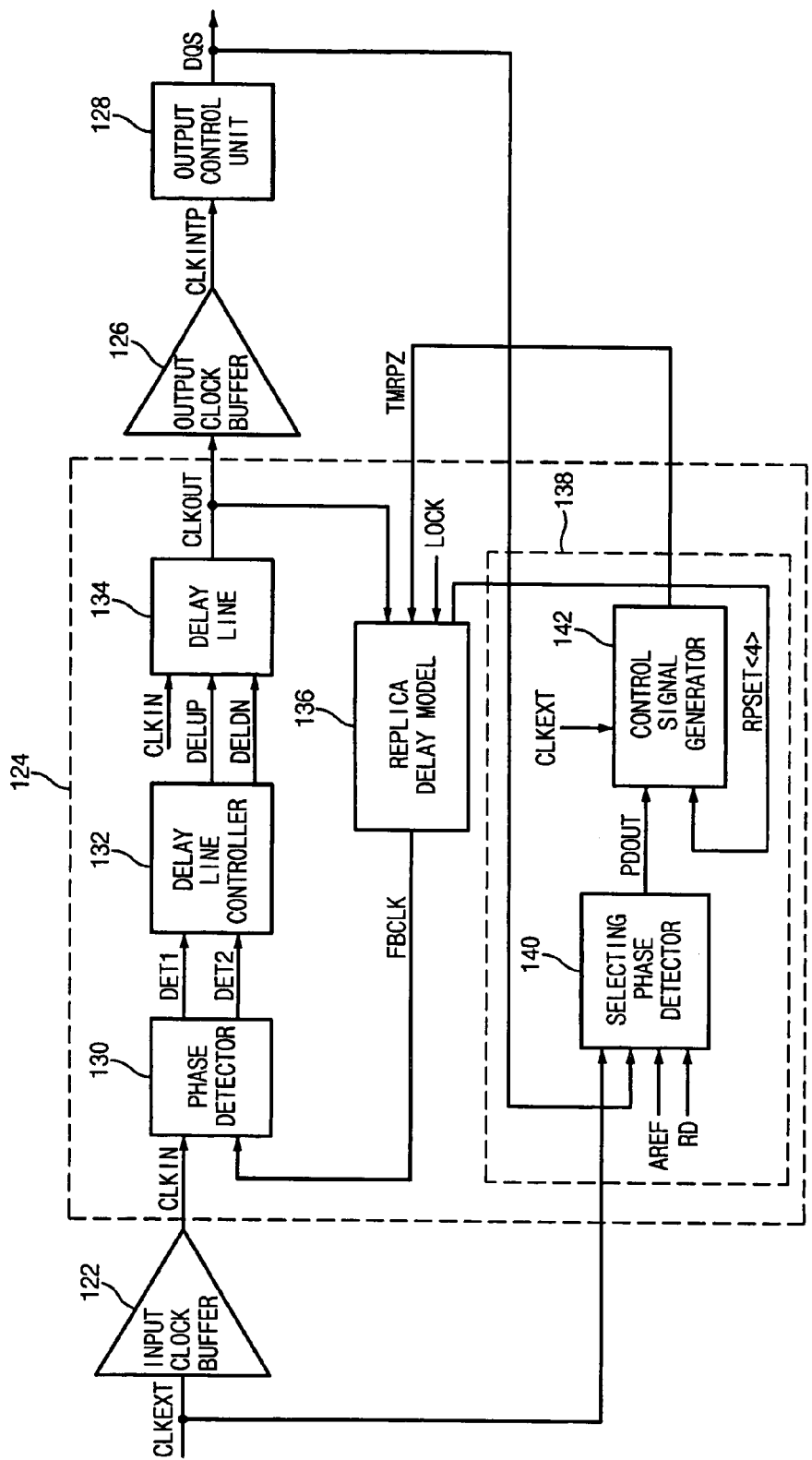
FIG. 13 is a block diagram illustrating a memory device including a DLL according to another embodiment of the present invention.

FIG. 13 is a block diagram illustrating a memory device including a DLL according to another embodiment of the present invention.

In another embodiment, the memory device includes an input clock buffer 122, a DLL 124, an output clock buffer 126, an output control unit 128 and a delay model control unit 138.

The input clock buffer 122 buffers an externally inputted external clock CLKEXT to an internal clock CLKIN.

The DLL 124 includes a phase detector 130, a delay line 132, a delay line controller 134 and a replica delay model 136. The phase detector 130 compares the internal clock CLKIN outputted from the input clock buffer 122 with a phase of a feedback clock FBCLK fed back through an internal circuit. The delay line 132 delays a phase of the internal clock CLKIN. The delay line controller 134 regulates a delay ratio of the delay line 132 using an output signal from the phase detector 130. The replica delay model 136 models delay factors of the input clock buffer 122 and other delay factors until an output clock CLKOUT from the delay line 132 is outputted to the outside of a chip.

The delay line 132 is controlled by the phase detector 130 and forms a delay path for determining a phase delay ratio. Here, the delay line 132 includes a plurality of unit delay cells connected in series, and signals fro controlling each unit delay cell correspond one by one to signals outputted from the delay line controller 134.

The delay line controller 134 includes a bidirectional shift register which sets a logic circuit for setting input paths of the delay line 132 and locations of paths. Here, the shift register is configured to set the initial maximum/minimum delay time. Additionally, the delay line controller 134 outputs a signal for controlling the delay line 132 in response to a state detected by the phase detector 130. The delay line controller 134 outputs a shift left signal DELUP to increase the delay ratio at the lead state, and a shift right signal DELDN to decrease the delay ratio at the lag state. However, the delay line controller 134 does not generate a shift signal but outputs a synchronization state signal LOCK at the lock state.

The replica delay model 136 shrinks, simplifies or uses an internal circuit as it is except the DLL from input to output of the external clock CLKEXT as a DQS. The replica delay model 136 regulates the delay ratio in response to a synchronization state signal LOCK externally inputted in a test mode, and the delay ratio of the replica delay model 136 is regulated in response to a control signal TMRPZ outputted from the replica delay model control unit 138.

The output clock buffer 126 buffers the output clock CLKOUT outputted from the delay line 132.

The output control unit 128 generates a DQS using an output clock CLKINTP from the output clock buffer 126. In the output control unit 128, if the memory device automatically compensates the skew by an auto refresh command AREF, the compensation operation can be performed as a background operation in a read mode or when an auto refresh command wherein the memory device does transmit data externally is inputted. As a result, the DQS is generated not only in the read mode but also in the auto refresh mode, thereby performing the phase comparison of the external clock signal CLKEXT and the DQS.

The replica delay model control unit 138 includes a selecting phase detector 140 and a control signal generator 142. The selecting phase detector 140 compares the phase of the external clock CLKEXT with that of the DQS in response to an auto refresh command AREF and a read command RD. When the rising edge of the DQS leads that of the external clock CLKEXT, that is, the rising edge of the DQS is in a low level pulse interval of the external clock CLKEXT, the selecting phase detector 140 outputs a phase detecting signal PDOUT of a low level. When the rising edge of the DQS lags that of the external clock CLKEXT, the selecting phase detector 140 outputs a phase detecting signal PDOUT of a high level. The control signal generator 142 generates a control signal TMRPZ in response to the phase detecting signal PDOUT outputted from the selecting phase detector 140. If the final delay setting data RPSET<4> becomes at a high level, the control signal TMRPZ is initialized to the high level.

Figure 14:
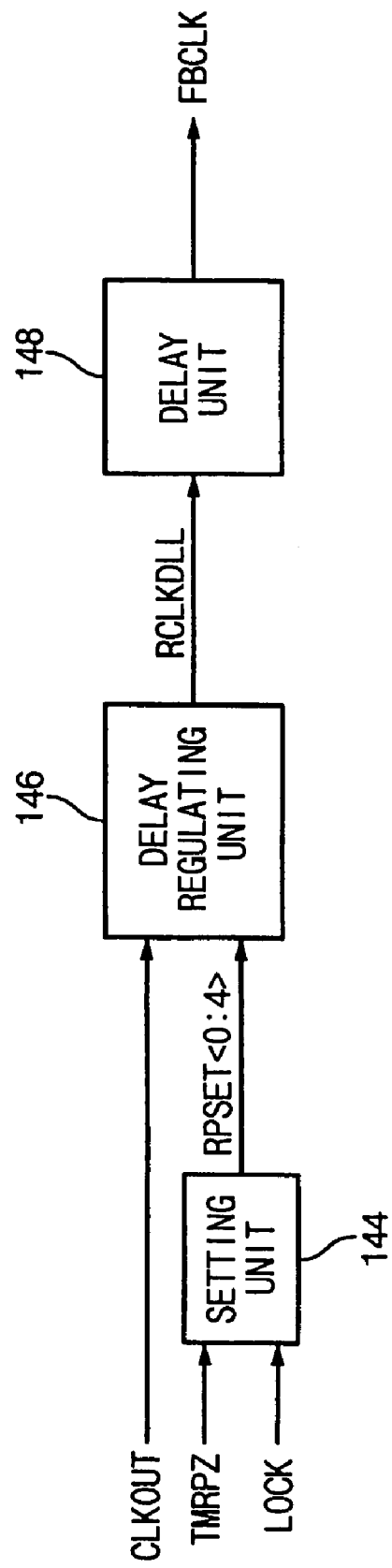
FIG. 14 is a detailed block diagram illustrating a replica delay model 136 of FIG. 13.

FIG. 14 is a detailed block diagram illustrating the replica delay model 136 of FIG. 13.

The replica delay model 136 includes a setting unit 144, a delay regulating unit 146 and a delay unit 148.

The setting unit 144 generates delay setting data RPSET<0:4> in response to the control signal TMRPZ and the synchronization signal LOCK.

The delay regulating unit 146 regulates delay time in response to the delay setting data RPSET<0:4> outputted from the setting unit 144.

The delay unit 148 outputs a feedback clock signal FBCLK by delaying a clock signal RCLKDLL outputted from the delay regulating unit 146 for a predetermined time.

The detailed explanation on configurations of the setting unit 144, the delay regulating unit 146 and the delay unit 148 of FIG. 14 is omitted because it is the same as those of FIGS. 8 to 10.

Figure 15:
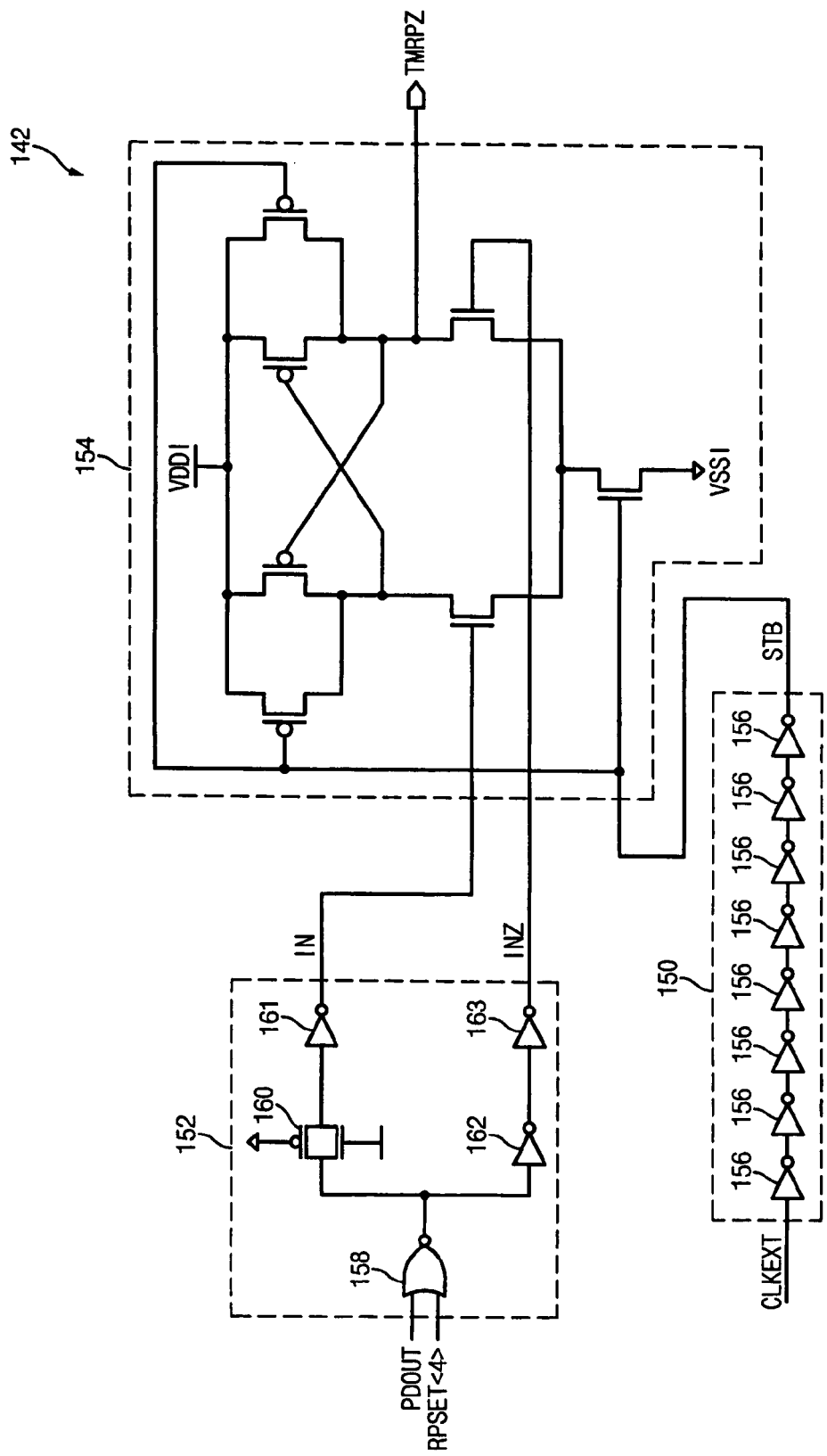
FIG. 15 is a detailed block diagram illustrating a control signal generating unit 142 of FIG. 13.

FIG. 15 is a detailed block diagram illustrating the control signal generating unit 142 of FIG. 13.

The control signal generator 142 includes an enable unit 150, a control unit 152 and a generating unit 154.

The enable unit 150 which includes a plurality of inverters 156 generates a strobe signal STB for enabling the generating unit 154 by delaying the output clock CLKOUT for a predetermined time.

The control unit 152 includes a NOR gate 158, a transmission gate 160, and inverters 161, 162 and 163. The control unit 152 generates comparison signals IN and INZ using the phase detecting signal PDOUT outputted from the selecting phase detector 140 and the final setting data RPSET<4>. Here, the transmission gate 160 is used to adjust timing of the comparison signals IN and INZ.

The generating unit 154 which comprises a latch type differential amplifier is enabled by the strobe signal STB outputted from the enable unit 150, and sets the state of the control signal TMRPZ in response to the comparison signals IN and INZ outputted from the control unit 152.

FIGS. 16 to 19 are timing diagrams illustrating the operation of the memory device of FIG. 13.

Figure 16:
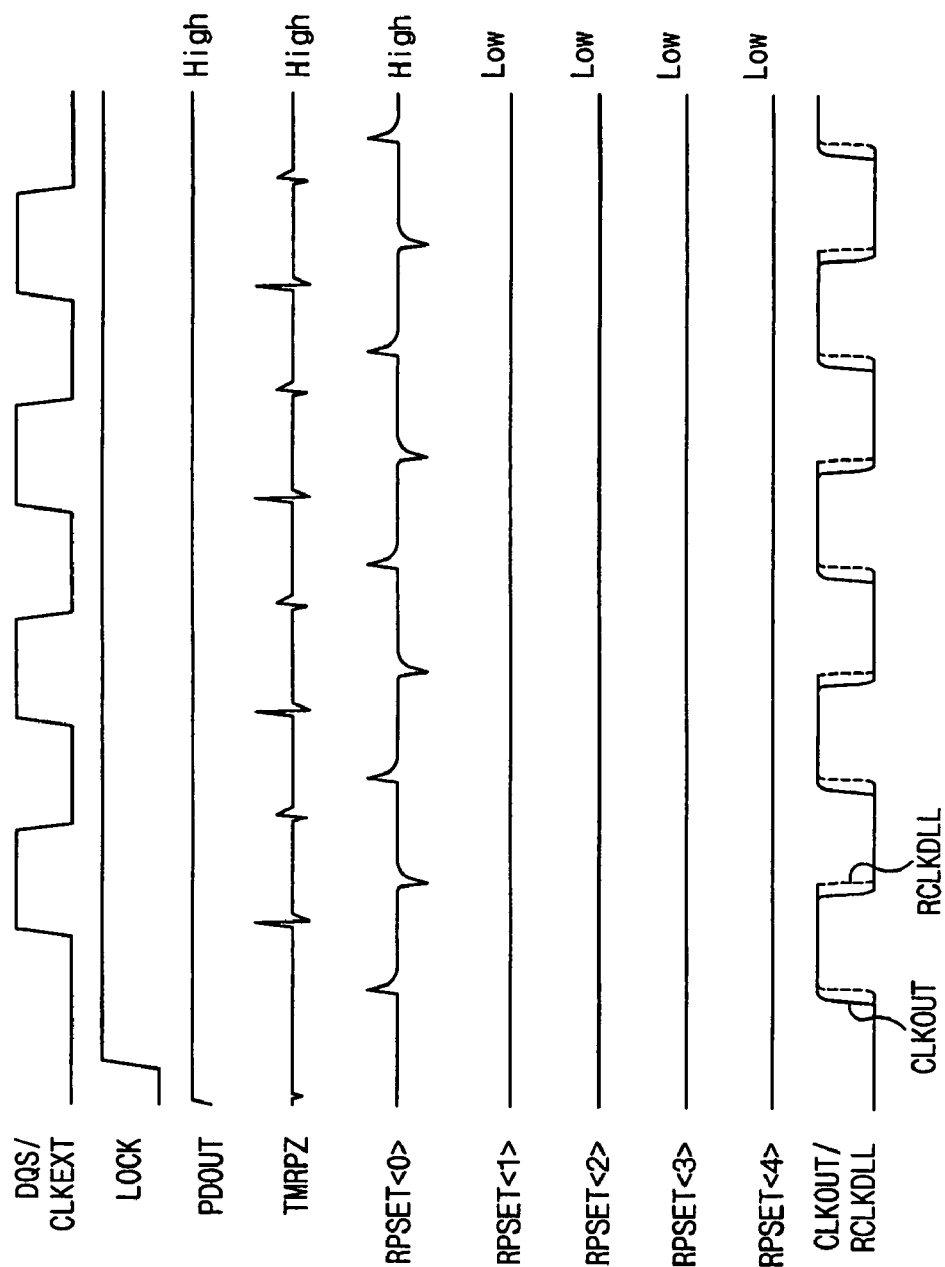
FIGS. 16 to 19 are timing diagrams illustrating the operation of the memory device of FIG. 13.

FIG. 16 shows when the DQS is locked to the external clock signal CLKEXT and the synchronization state signal LOCK and the phase detecting signal PDOUT become at a high level.

As a result, the control signal TMRPZ is maintained at a high level, the setting data RPSET<0:4> are initialized, and the delay regulating unit 146 is set at the minimum delay ratio.

Figure 17:
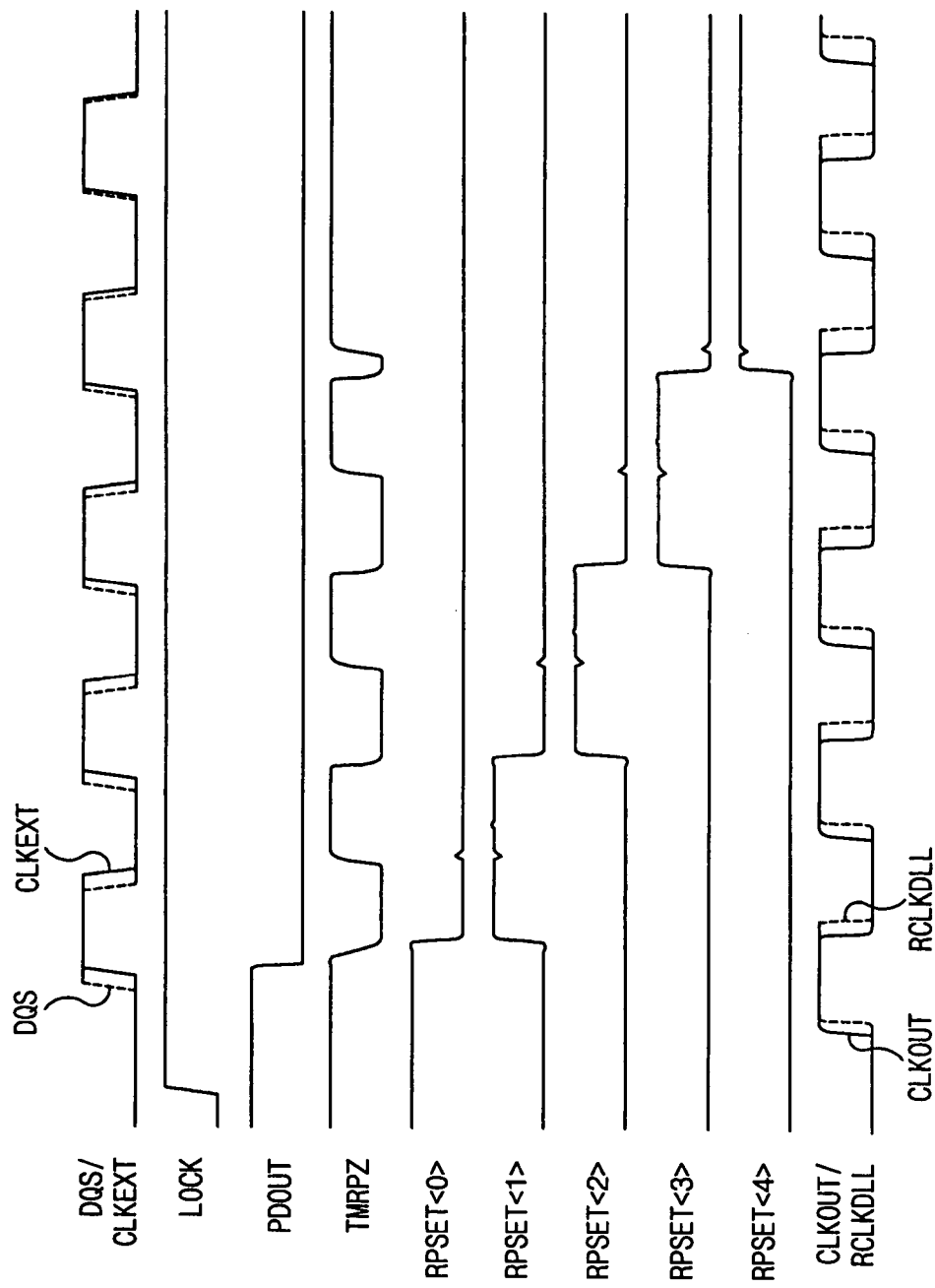

FIG. 17 shows when the delay ratio of the delay regulating unit 146 increases to the maximum delay ratio at the lock state of the DQS and the external clock signal CLKEXT.

The DQS is synchronized to have below a predetermined phase difference, and the synchronization state signal LOCK becomes at a high level. However, the selecting phase detector 140 generates the phase detecting signal PDOUT of a low level since the phase difference of the DQS and the external clock signal CLKEXT is over a predetermined phase difference.

As a result, the setting data RPSET<0:4> is shifted in every cycle of the control signal TMRPZ synchronized to the external clock signal CLKEXT.

Here, if the final setting data RPSET<4> becomes at a high level, the control signal TMRPZ is initialized to a high level by the control signal generator 142. Accordingly, the delay ratio of the delay regulating unit 146 is maintained as a maximum value.

Figure 18:
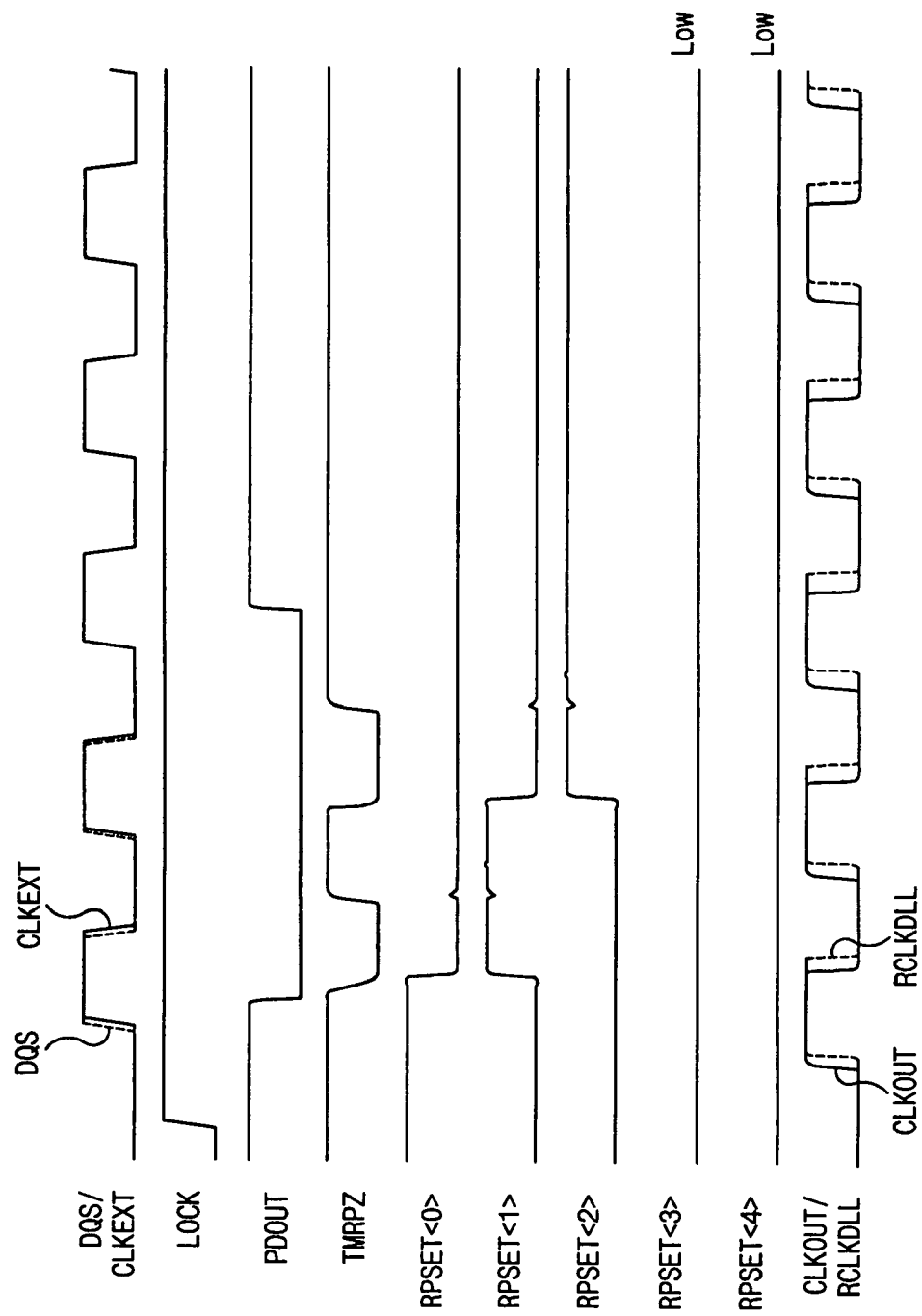

FIG. 18 shows when the delay ratio of the delay regulating unit 146 increases to be set as the lock state at the lock state of the DQS and the external clock signal CLKEXT.

The DQS is synchronized to have below a predetermined phase difference, and the synchronization state signal LOCK becomes at a high level. However, the selecting phase detector 140 generates the phase detecting signal PDOUT of a low level since the phase difference of the DQS and the external clock signal CLKEXT is over a predetermined phase difference.

As a result, the setting data RPSET<0:4> is shifted in every cycle of the control signal TMRPZ synchronized to the external clock signal CLKEXT. That is, the delay ratio of the delay regulating unit 146 gradually increases.

Here, if the phase difference of the DQS and the external clock signal CLKEXT is below a predetermined phase difference and the phase detecting signal PDOUT becomes at a high level, the control signal TMRPZ is maintained at the high level and the current delay ratio of the delay regulating unit 146 is maintained.

Figure 19:
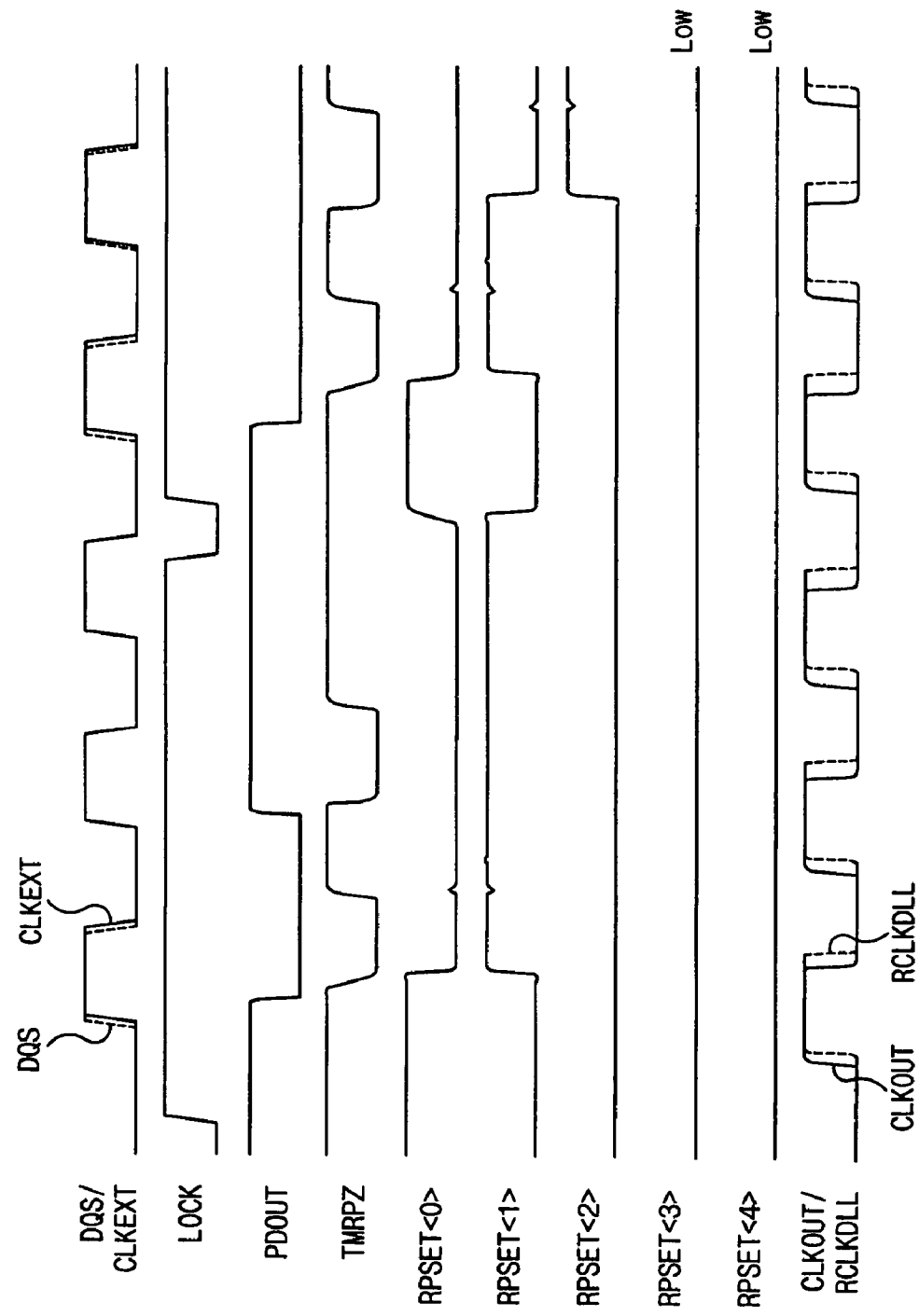

FIG. 19 shows when the delay ratio of the delay regulating unit 146 increases again after the lock state of the DQS and the external clock signal CLKEXT is finished, entered to the initial state and then come back to the lock state.

The DQS is synchronized to have below a predetermined phase difference, and the synchronization state signal LOCK becomes at a high level. However, the selecting phase detector 140 generates the phase detecting signal PDOUT of a low level since the phase difference of the DQS and the external clock signal CLKEXT is over a predetermined phase difference.

As a result, the setting data RPSET<0:4> are shifted in every cycle of the control signal TMRPZ synchronized to the external clock signal CLKEXT. That is, the delay ratio of the delay regulating unit 146 gradually increases.

Thereafter, if the phase difference of the DQS and the external clock signal CLKEXT is below a predetermined phase difference and the phase detecting signal PDOUT becomes at a high level, the control signal TMRPZ is maintained at the high level and the current delay ratio of the delay regulating unit 146 is maintained.

Here, the lock state is finished, the synchronization state signal LOCK becomes at a low level, and the initial state is set. The setting data RPSET<0:4> are set as an initial value "HLLLL", and the delay ratio of the delay regulating unit 146 is set as a minimum value.

Thereafter, if the lock state is started again, the synchronization state signal LOCK becomes at a high level, the setting data RPSET<0:4> are shifted in every cycle of the control signal TMRPZ. That is, the delay ratio of the delay regulating unit 146 gradually increases.

As discussed earlier, in an embodiment of the present invention, a memory device including a DLL can minimize the skew between an external clock signal and a DQS by regulating a delay ratio of a replica delay model to compensate errors of process, temperature or voltage change.

Additionally, the memory device including a DLL can minimize the skew between an external clock signal and a DQS by directly comparing the phase of the DQS with that of the external clock signal and regulating a delay ratio of a replica delay model to compensate errors of process, temperature or voltage change.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A memory device comprising: an input clock buffer for buffering an externally inputted external clock to generate an internal clock; a DLL for delaying the internal clock to synchronize a phase of the external clock with that of a DQS; an output clock buffer for buffering an output clock outputted from the DLL; and an output control unit for generating the DQS using a clock outputted from the output clock buffer, wherein the DLL comprises:

a delay line for delaying a phase of the internal clock;

a phase detector for comparing a phase of the internal clock with that of a feedback clock fed back through an internal circuit;

a delay line controller for regulating a delay ratio to delay the internal clock in response to a phase detecting signal outputted from the phase detector; and a replica delay model for modeling delay factors of the input clock buffer and other delay factors until the output clock outputted from the delay line is outputted to the outside of a chip, and for regulating a delay ratio in response to a plurality of control signals inputted externally in a test mode.

2. The device according to claim 1, wherein the replica delay model comprises:

a plurality of delay paths having a different delay ratio respectively and for delaying an output clock outputted from the DLL;

a delay regulating unit for selecting one of the plurality of delay paths by the control signals; and a delay unit for delaying a clock outputted from the delay regulating unit for a predetermined time.

3. The device according to claim 2, wherein the delay regulating unit further comprises a setting unit for generating a plurality of delay setting data in response to the control signals.

4. The device according to claim 3, wherein the setting unit comprises a plurality of unit shift units having a ring structure and for outputting the plurality of delay setting data in response to the control signals.

5. The device according to claim 4, wherein the unit shift unit comprises:

a first transmission unit for selectively transmitting a signal inputted through an input terminal in response to the control signal;

a first latch unit for latching a signal transmitted by the first transmission unit;

a second transmission unit for selectively transmitting a signal latched in the latch unit in response to the control signal; and a second latch unit for latching a signal transmitted by the second transmission unit.

6. The device according to claim 5, wherein the second latch unit is initialized by the control signal.

7. The device according to claim 3, wherein the delay regulating unit further comprises a plurality of selecting units for selecting one of the plurality of delay paths in response to the plurality of delay setting data.

8. The device according to claim 7, wherein the plurality of selecting units comprise a plurality of transmission units controlled by the delay setting data one by one.

9. The device according to claim 4, wherein the unit shift unit comprises:

a first transmission unit for selectively transmitting a signal inputted through an input terminal in response to the output signal from the replica delay model controller;

a first latch unit for latching a signal transmitted by the first transmission unit;

a second transmission unit for selectively transmitting a signal latched in the latch unit in response to the output signal from the replica delay mode controller; and a second latch unit for latching a signal transmitted by the second transmission unit.

10. The device according to claim 9, wherein the second latch unit is initialized by a synchronization state signal outputted from the delay line controller if a synchronization state is set by the phase detector.

11. A memory device comprising: an input clock buffer for buffering an externally inputted external clock to generate an internal clock; a DLL for delaying the internal clock to synchronize a phase of the external clock with that of a DQS; an output clock buffer for buffering an output clock outputted from the DLL; and an output control unit for generating the DQS using a clock outputted from the output clock buffer, wherein the DLL comprises:

a delay line for delaying a phase of the internal clock;

a first phase detector for comparing a phase of the internal clock with that of a feedback clock fed back through an internal circuit;

a delay line controller for regulating a delay ratio to delay the internal clock in response to a phase detecting signal outputted from the phase detector;

a replica delay model controller for comparing a phase of the external clock with that of the DQS; and a replica delay model for modeling delay factors of the input clock buffer and other delay factors until the output clock outputted from the delay line is outputted to the outside of a chip, and for regulating a delay ratio in response to an output signal outputted from the replica delay model controller in a test mode.

12. The device according to claim 11, wherein the replica delay model comprises:
   a plurality of delay paths having a different delay ratio each other and for delaying an output clock outputted from the DLL;
   a delay regulating unit for selecting one of the plurality of delay paths by an output signal from the replica delay mode controller; and
   a delay unit for delaying a clock outputted from the delay regulating unit for a predetermined time.

13. The device according to claim 12, wherein the delay regulating unit further comprises a setting unit for generating a plurality of delay setting data in response to the output signal from the replica delay model controller.

14. The device according to claim 13, wherein the setting unit comprises a plurality of unit shift units having a ring structure and for outputting the plurality of delay setting data in response to the output signal from the replica delay mode controller.

15. The device according to claim 13, wherein the delay regulating unit further comprises a plurality of selecting units for selecting one of the plurality of delay paths in response to the plurality of delay setting data.

16. The device according to claim 15, wherein the plurality of selecting units comprises a plurality of transmission units controlled by the delay setting data one by one.

17. The device according to claim 13, wherein the replica delay model controller comprises:
   a second phase detector for comparing a phase of the external clock with that of the DQS; and
   a control signal generator for generating a clock synchronized with respect to the external clock in response to an output signal from the second phase detector.

18. The device according to claim 17, wherein the second phase detector is enabled by an auto refresh command or a read command.

19. The device according to claim 17, wherein the control signal generator is initialized when the delay setting data has the maximum value.

20. The device according to claim 11, wherein the output controller is enabled by an auto refresh command.

* * * * *